United States Patent
Tsui et al.

(10) Patent No.: US 6,923,669 B1
(45) Date of Patent: Aug. 2, 2005

(54) MICROCONNECTORS AND NON-POWERED MICROASSEMBLY THEREWITH

(75) Inventors: Kenneth Tsui, Richardson, TX (US); Aaron Geisberger, Dallas, TX (US); George Skidmore, Richardson, TX (US)

(73) Assignee: Zyvex Corporation, Richardson, TX (US)

( * ) Notice: Subject to any disclaimer, the term of this patent is extended or adjusted under 35 U.S.C. 154(b) by 0 days.

(21) Appl. No.: 10/778,460

(22) Filed: Feb. 13, 2004

(51) Int. Cl.[7] .......................................... H01R 13/627
(52) U.S. Cl. ...................................................... 439/353
(58) Field of Search ................................ 439/350, 351, 439/353, 357

(56) References Cited

U.S. PATENT DOCUMENTS

| | | | |
|---|---|---|---|
| 5,963,788 A * | 10/1999 | Barron et al. .................. | 438/48 |
| 6,103,399 A * | 8/2000 | Smela et al. .................. | 428/623 |
| 6,219,254 B1 * | 4/2001 | Akerling et al. ............. | 361/763 |
| 6,300,156 B1 * | 10/2001 | Decker et al. ................. | 438/52 |
| 6,398,280 B1 * | 6/2002 | Parker et al. ............... | 294/86.4 |
| 6,561,725 B1 * | 5/2003 | Ellis et al. ................... | 403/326 |
| 6,672,795 B1 * | 1/2004 | Ellis et al. ................... | 403/327 |
| 6,745,567 B1 * | 6/2004 | Mercanzini ................... | 60/527 |
| 6,762,116 B1 * | 7/2004 | Skidmore .................... | 438/598 |
| 2002/0125208 A1 * | 9/2002 | Christenson et al. .......... | 216/2 |

OTHER PUBLICATIONS

Ellis, et al., "High aspect ratio silicon micromechanical connectors", High Aspect Ratio Micro-Structure Technology Workshop, Jun. 15-17, 2003, Monterey, California USA.

Dechev et al., "Microassembly of 3-D Microstructure Using a Compliant, Passive Microgripper," Journal of Microelectromechanical Systems, vol. 13, No. 2, Apr. 2004, pp. 176-189.

Tsui et al., "Micromachined end-effector and techniques for directed MEMS assembly," Journal of Micromechanics and Microengineering, Institute of Physics Publishing, United Kingdom 2004, pp. 1-8.

* cited by examiner

*Primary Examiner*—Ross Gushi
(74) *Attorney, Agent, or Firm*—Haynes and Boone, LLP

(57) ABSTRACT

A MEMS microconnector including a compliant handle and a deflectable connection member. The compliant handle is configured to frictionally engage a manipulation probe. The deflectable connection member includes a first end coupled to the handle and a second end configured to deflect and thereby engage a receptacle in response to disengagement of the manipulation probe from the handle.

40 Claims, 10 Drawing Sheets

MICROCONNECTORS AND NON-POWERED MICROASSEMBLY THEREWITH

This invention was made with the United States Government support under 70NANB1H3021 awarded by the National Institute of Standards and Technology (NIST). The United States Government has certain rights in the invention.

BACKGROUND

The present disclosure relates generally to MEMS devices, more specifically, to non-powered MEMS microconnectors and microassembly therewith.

Extraordinary advances are being made in micromechanical devices and microelectronic devices, including micro-electro-mechanical devices (MEMs), which comprise integrated micromechanical and microelectronic devices. The terms "microcomponent," "microconnector," "microdevice," and "microassembly" are used herein generically to encompass microelectronic components, micromechanical components, MEMs components and assemblies thereof.

Many methods and structures exist for coupling MEMs and other microcomponents together to form a microassembly. One such method, often referred to as "pick-and-place" assembly, is serial microassembly, wherein microcomponents are assembled one at a time in a serial fashion. For example, if a device is formed by coupling two microcomponents together, a gripper or other placing mechanism is used to pick up one of the two microcomponents and place it on a desired location of the other microcomponent. These pick-and-place processes, although seemingly quite simple, can present obstacles affecting assembly time, throughput and reliability.

For example, pick-and-place processes often employ powered "grippers" having end effectors configured to expand and/or contract in response to energy received from an integral or external power source. However, structural fragility, increased packaging complexity, and uncertainties due to variations in actuator displacements limit the practical usefulness of employing such powered grippers during microassembly.

Accordingly, what is needed in the art is a MEMS microconnector and a method of microassembly therewith that addresses the above-discussed issues.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
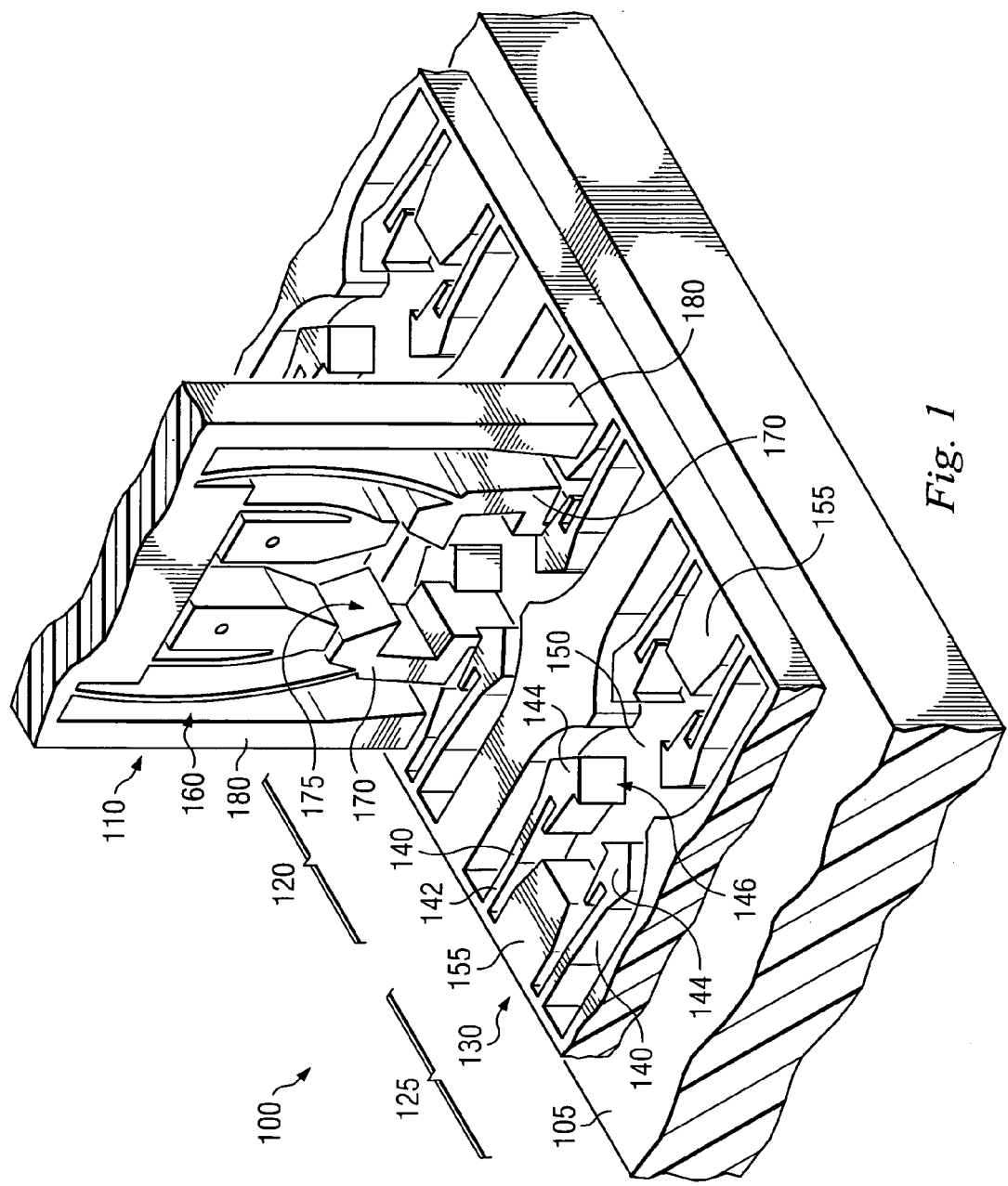
FIG. 1 illustrates a perspective view of a portion of one embodiment of a microassembly according to aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a perspective view of a portion of one embodiment of a microassembly 100 constructed according to aspects of the present disclosure. The microassembly 100 includes a microconnector 110 assembled to a receptacle 120. A portion of an unoccupied receptacle 125 is also shown. In the illustrated embodiment, the microconnector 110 has been assembled to the receptacle 120 without the use of a powered gripper or other actuator.

The microconnector 110 and the receptacle 120 may be micro-electro-mechanical system (MEMS) components having feature dimensions that are less than about 1000 microns. The microconnector 110 and the receptacle 120 may also be nano-electro-mechanical system (NEMS) components having feature dimensions that are less than about 10 microns. This convention may be generally applied to any microcomponent of the microassemblies described herein. For example, the microassembly 100 and others described below may include MEMS components having feature dimensions that are less than about 1000 microns and/or NEMS components having feature dimensions that are less than about 10 microns.

The receptacles 120, 125 are defined in or otherwise coupled to a substrate 105, and each include a retainer 130 which, at least in the embodiment shown, includes two legs 140. The legs 140 are coupled to or otherwise affixed to the substrate 105 at one end 142 and are free to translate across the substrate 105 at another end 144. The ends 144 have tapered surfaces 146, such that insertion of a portion of the microconnector 110 therebetween causes the legs 140 to deflect away from each other. The receptacles 120, 125 also include an aperture 150 configured to receive a portion of the microconnector 110, as well as one or more anchor pads 155.

The microconnector 110 includes a deflectable connection member 160 which, at least in the embodiment shown, includes two legs 170. The legs 170 have a pre-engaged position in which they are configured to fit within the aperture 150. Once oriented within the aperture 150, the legs 170 may be configured to deflect away from each other to each engage and/or be engaged by a corresponding pair of receptacle legs 140 (as in the orientation shown in FIG. 1). In one embodiment, the legs 170 include tapered surfaces 175 to enable such deflection of the legs 170. The microconnector 110 also includes one or more anchor arms 180 configured to stop or rest against one or more corresponding anchor pads 155.

Figure 2A:
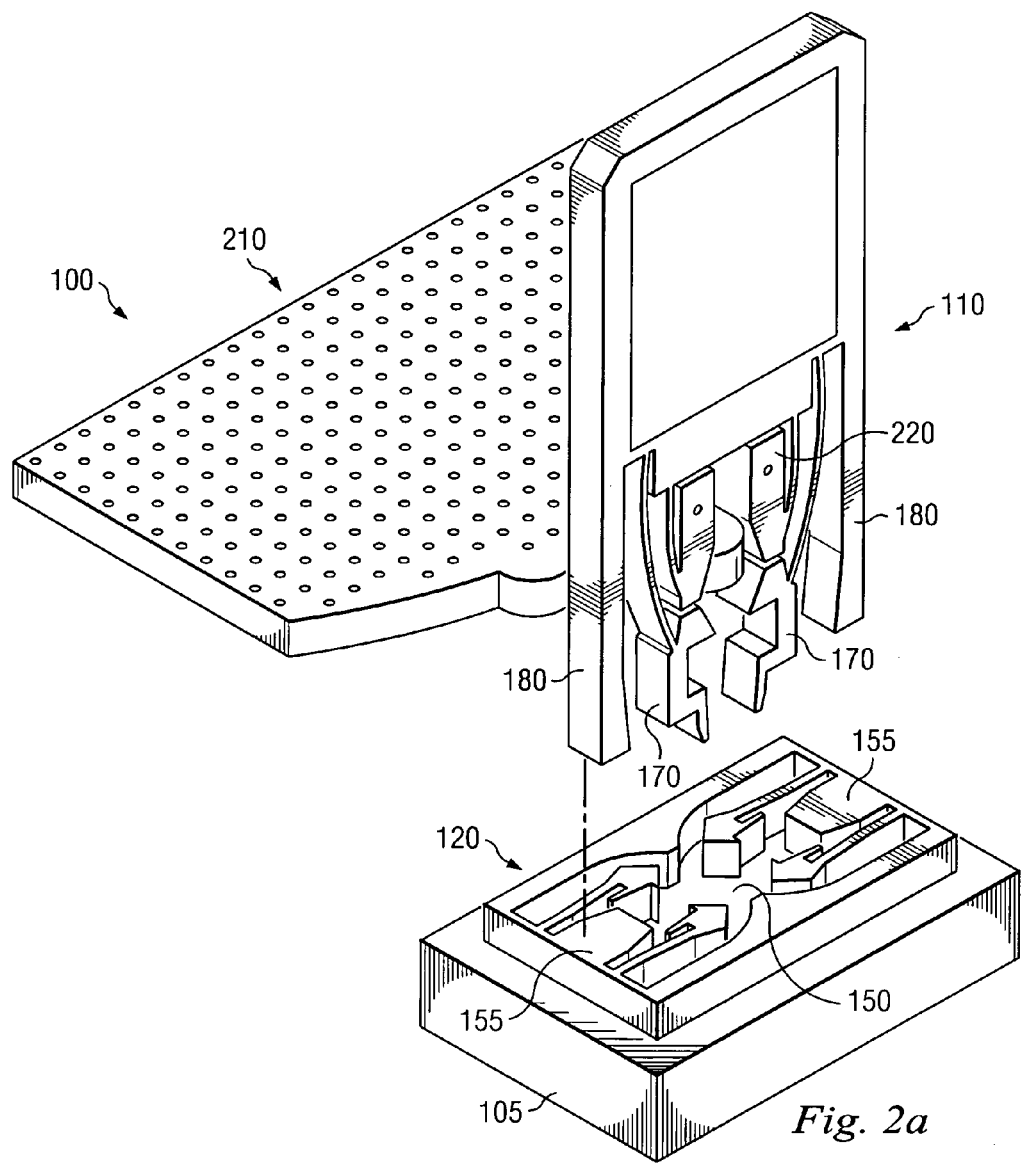
FIGS. 2a and 2b illustrate perspective views of intermediate stages of one embodiment of microassembly according to aspects of the present disclosure.
Figure 2B:
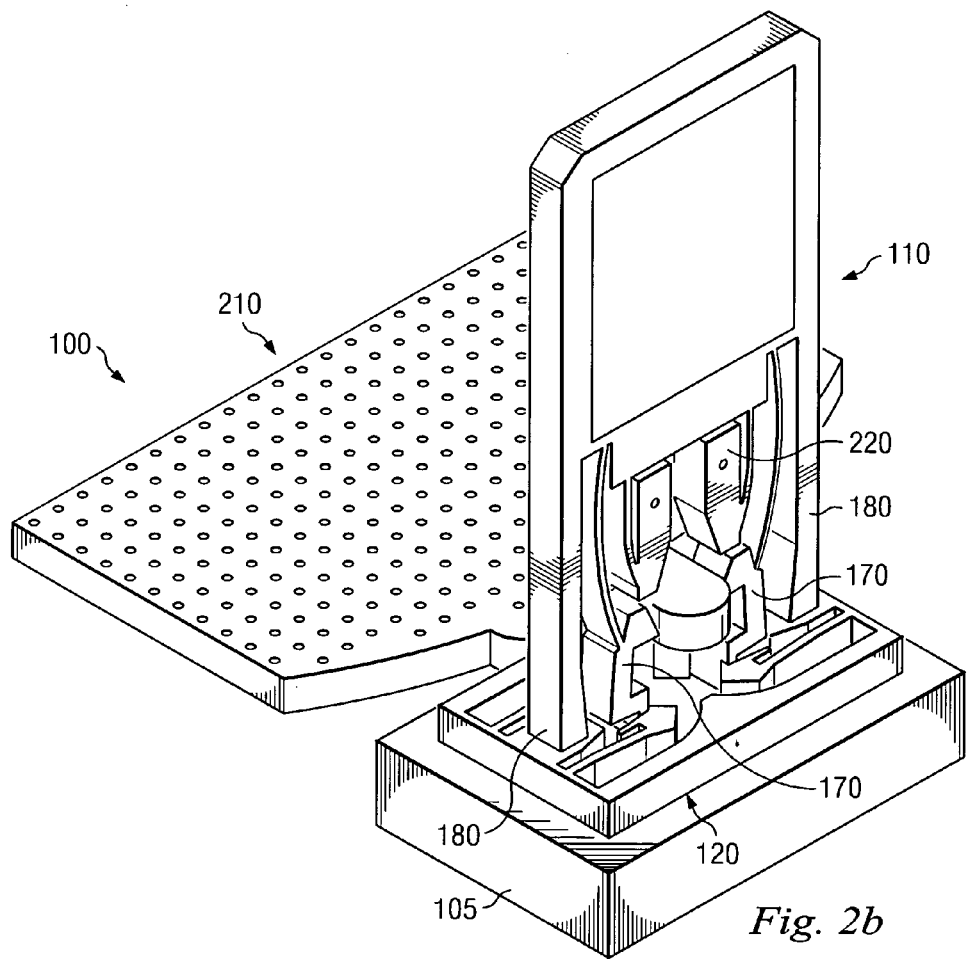

Referring to FIGS. 2a and 2b, with continued reference to FIG. 1, illustrated are perspective views of the microassembly 100 shown in FIG. 1 during intermediate stages of assembly. In FIG. 2a, the microconnector 110 has been retained by a manipulation probe 210. The microconnector 110 may include a compliant handle 220 configured to deflect as the manipulation probe 210 is inserted, and the manipulation probe 210 may have a profile that allows it to be inserted into the compliant handle 220 by translation in one or more directions. The compliant handle 220 may include two or more members configured to deflect away from each other or towards each other, depending on the shape of the manipulation probe 210.

After engaging the microconnector 110 with the manipulation probe 210, the microconnector 110 may be oriented as necessary for pre-assembly alignment with the receptacle 120. Such orientation may include translation and/or rotation relative to the substrate 105. For example, in the illustrated embodiment, the manipulation probe 210 may have been employed to remove the microconnector 110 from a configuration substantially parallel to that of the receptacle 120 and, thereafter, rotate the microconnector 110 about 90 degrees relative to the substrate 105 and align the microconnector 110 over the receptacle 120. In other embodiments, substantial parallelism of the microconnector 110 and the receptacle 120 may be maintained while the manipulation probe 210 orients the microconnector 110 relative to the receptacle 120.

As shown in FIG. 2b, the manipulation probe 210 may be manipulated to bring the microconnector 110 and the receptacle 120 into contact with each other. As discussed above, the microconnector 110 may include legs 170 configured to be received within an aperture 150 in the receptacle 120 as the microconnector anchor arms 180 are brought into contact with receptacle anchor pads 155. Thereafter, the manipulation probe 210 may be further translated towards the receptacle 120, whereby such further translation may cause the microconnector legs 170 and the receptacle legs 140 to each deflect outwards until they are allowed to engage each other. The manipulation probe 210 may then be translated out of the handle 220 and then substantially parallel to the substrate 105 to remove the probe 210 from the microconnector 110, wherein the microconnector 110 may remain assembled to the receptacle 120.

Figure 3:
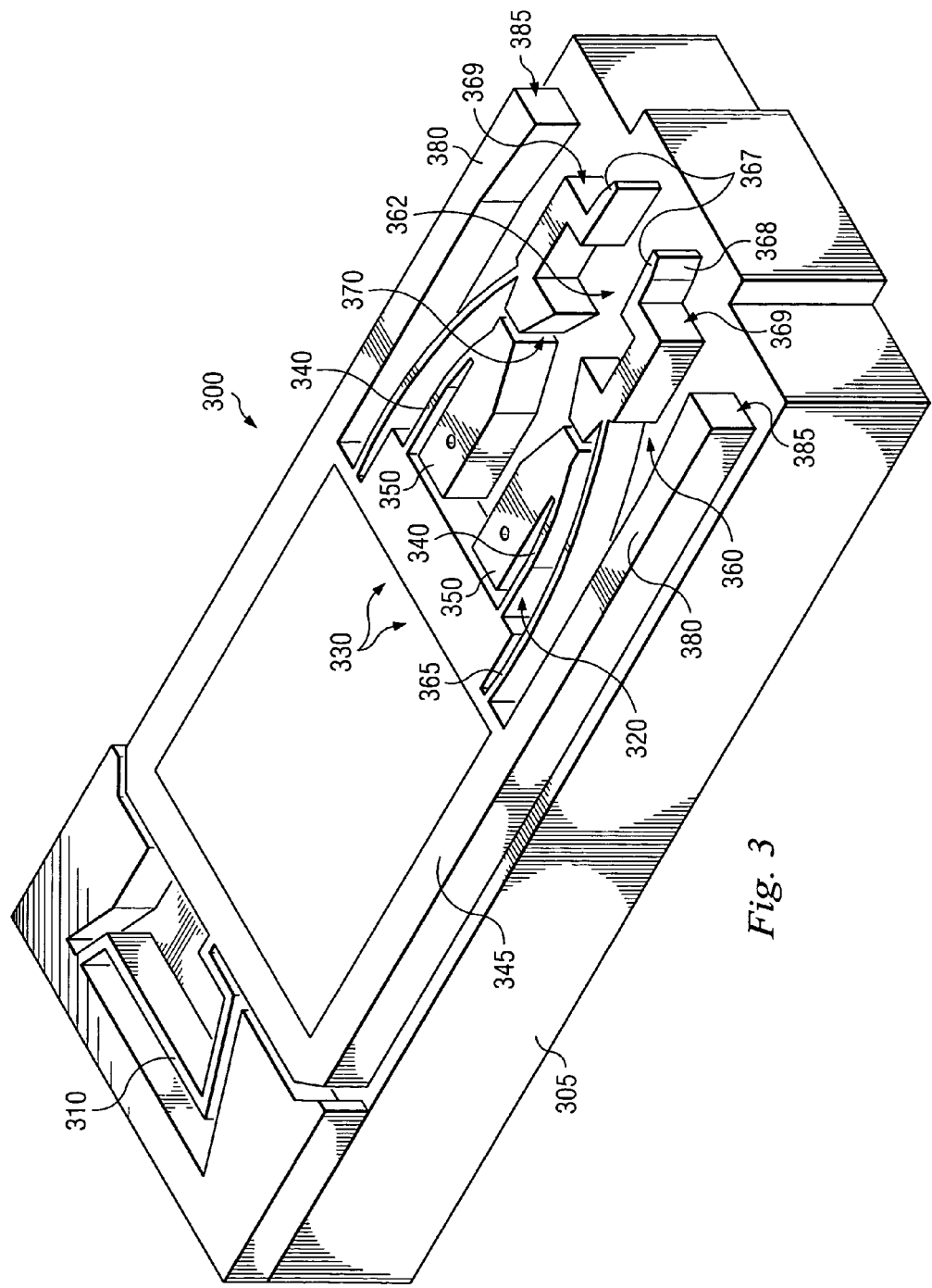
FIG. 3 illustrates a perspective view of one embodiment of a microconnector according to aspects of the present disclosure.

Referring to FIG. 3, illustrated is a perspective view of one embodiment of a microconnector 300 constructed according to aspects of the present disclosure. In one embodiment, the microconnector 300 is substantially similar to the microconnector 110 shown in FIGS. 1, 2a and 2b.

The microconnector 300 may be defined in a single-crystalline silicon (SCS) layer, possibly having a thickness ranging between about 25 $\mu$m and about 200 $\mu$m. The SCS layer may be located over a sacrificial layer formed over a substrate 305, wherein the sacrificial layer may comprise oxide and/or other materials and may have a thickness ranging between about 1 $\mu$m and about 30 $\mu$m. One or more deep reactive ion etching (DRIE) processes and/or other processes may be employed to define the microconnector 300 from the SCS layer. Such a manufacturing process flow may include a backside DRIE through the substrate 305 or a handle portion thereof. In-plane electrical isolation may be achieved by trenches formed in the SCS layer and filled with nitride and/or another electrically insulating material.

The microconnector 300 is released from the substrate 305 after fabrication and prior to assembly. Such a release process may employ a wet-etch of the sacrificial layer, possibly employing a 49% HF solution or other etchant chemistry. The microconnector 300 may also include a tether 310 defined in the SCS layer, such that the microconnector 300 does not become completely detached from the substrate 305 during the release process.

The microconnector 300 includes a handle 320 configured to frictionally engage a manipulation probe, such as the probe 210 shown in FIG. 2. In one embodiment, the handle 320 is defined in the SCS layer as having two or more compliant legs 330 configured to deflect away from each other in response to insertion of the manipulation probe. Thus, the handle 320 may be a compliant handle. The legs 330 may be formed separated from each other by a distance about equal to or at least slightly less than the width of the manipulation probe tip or other portion configured to be grasped by the legs 330. In one embodiment, such separation between the legs 330 may range between about 25 $\mu$m and about 300 $\mu$m. Although not limited by the scope of the present disclosure, the legs 330 may have a length ranging between about 50 $\mu$m and about 500 $\mu$m.

As in the illustrated embodiment, the legs 330 (or perhaps one or more other portions of the handle 320) may each include narrower members 340 connected at one end to a microconnector body 345 and at a second end to wider members 350 configured to grasp the manipulation probe. The narrower members 340 may each have a width ranging between about 5 $\mu$m and about 30 $\mu$m, and the wider members 350 may each have a width ranging between about 10 $\mu$m and about 100 $\mu$m.

The microconnector 300 also includes a deflectable connection member 360 having at least one first end 365 coupled to the handle, possibly via the body 345, as in the illustrated embodiment. The connection member 360 also includes at least one second end 367 configured to deflect and thereby engage a receptacle in response to disengagement of a manipulation probe from the handle 320. The one or more second ends 367 may include a barb, hook, lip, extension, tab, and/or other means 368 (hereafter collectively referred to as a barb) for engaging, mating or otherwise interfacing with an edge, surface or barb of the receptacle. The one or more second ends 367 may also include a shoulder or other interface means 369 (hereafter collectively referred to as a shoulder) for engaging, mating or otherwise interfacing with an edge, surface or barb of the receptacle, in addition to or as an alternative to the barb 368.

The connection member 360 may include tapered surfaces 370 or other means for deflecting outward in response to translation of the manipulation probe away from a retained position within the handle 320. The connection member 360 may also include an aperture 362 permitting removal of the manipulation probe after the microconnector 300 is secured to the receptacle. The width of the aperture 362 may be about equal to or at least slightly greater than a manipulation probe or tip thereof. The microconnector 300 may also include one or more anchor arms 380 coupled or integral to the body 345 and extending to a bearing plane, shoulder or other type of interface 385 configured to rest against a receptacle as a manipulation probe is translated from the handle 320 towards the aperture 362.

As described above, the microconnector 300 may also include a tether 310 configured to prevent inadvertent release of the microconnector 300 from the substrate 305. Prior to microassembly of the microconnector 300 to another MEMS or NEMS component, the tether 310 may be severed to release the microconnector 300 from the substrate 305. Such de-tethering of the microconnector 300 from the substrate 305 may be mechanical, such as by translating and/or rotating the microconnector 300 away from the susbtrate 305 until the tether 310 breaks, or by pressing against and/or slicing into the tether 310 with a probe or other object. The microconnector 300 may also be de-tethered electrically, such as by increasing a current flow through the tether 310 until the tether 310 severs, possibly by ohmic heating. The tether 310 may have a width ranging between about 5 μm and about 30 μm.

Although not shown in the illustrated embodiment, the microconnector 300 may also include means for detecting when the microconnector 300 is fully engaged with a receptacle. For example, the interface means 369 may include conductive contacts and/or other means which may close a circuit across anchor pads of the receptacle. In one embodiment, the connection member 360 may be similarly or alternatively configured to close a circuit across the receptacle, thereby indicating engagement of the microconnector 300 and the receptacle.

Figure 4:
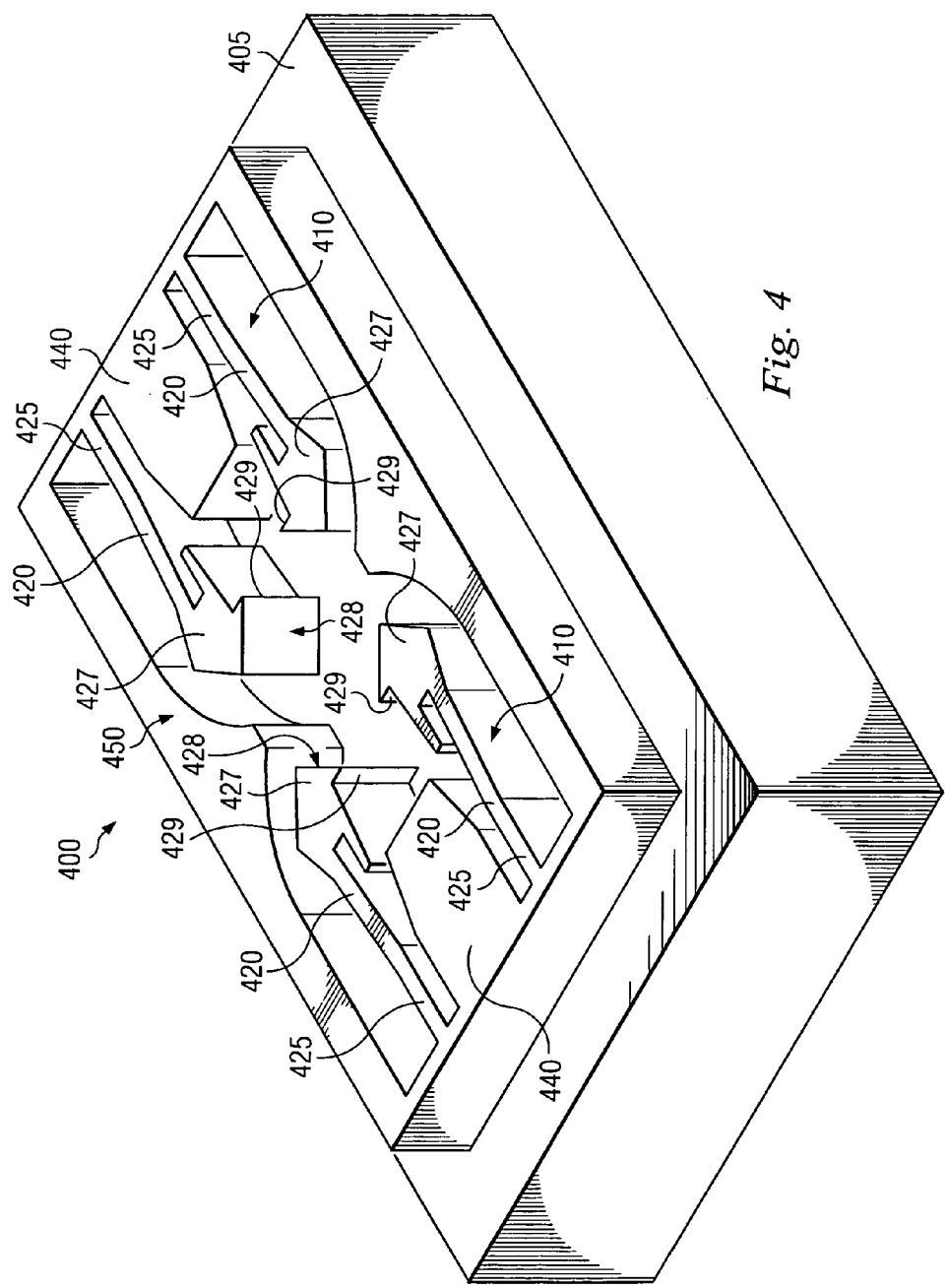
FIG. 4 illustrates a perspective view of one embodiment of a microconnector receptacle according to aspects of the present disclosure.

Referring to FIG. 4, illustrated is a perspective view of one embodiment of a receptacle 400 constructed according to aspects of the present disclosure. In one embodiment, the receptacle 400 is substantially similar to the receptacle 120 shown in FIGS. 1, 2a and 2b. The receptacle 400 may be substantially similar in composition and manufacture to the microconnector 300 shown in FIG. 3. In one embodiment, the receptacle 400 and the microconnector 300 are defined in a common SCS layer over a common substrate 405, possibly simultaneously.

The receptacle 400 includes one, two or more deflectable retainers 410. The retainers 410 each include one, two, or more legs 420. The legs 420 each include a first end 425 coupled to the substrate 405 and a second end 427 configured to translate across the substrate 405. The translation of the second ends 427 of the legs 420 across the substrate 405 may be in response to the travel of a portion of a microconnector (such as the second ends 367 of the microconnector 300 shown in FIG. 3) against tapered surfaces 428 of the second ends 427. Each of the second ends 427 may also include a barb, hook, lip, extension, tab, and/or other means 429 (hereafter collectively referred to as a barb) for engaging, mating or otherwise interfacing with an edge, surface or barb of a microconnector.

The receptacle 400 may also include one or more anchor pads 440 coupled or integral thereto. The anchor pads 440 may be configured to resist translation (e.g., provide a travel "stop") of a microconnector as a manipulation probe is translated within a microconnector towards the receptacle 400. For example, the anchor pads 440 may be configured to interface with the anchor arm interfaces 385 shown in FIG. 3.

The receptacle 400 may also include an aperture 450 configured to receive a portion of a microconnector during microassembly. For example, the aperture 450 may be sized to receive the ends 367 of the microconnector 300 shown in FIG. 3. Thus, a microconnector may be inserted into the aperture 450 of the receptacle 400 until the anchor pads 440 stop translation of the microconnector into the receptacle 400, such that further translation of a manipulation probe within the microconnector towards the receptacle 400 causes the retainers 410 to deflect and subsequently engage with the microconnector.

Figure 5:
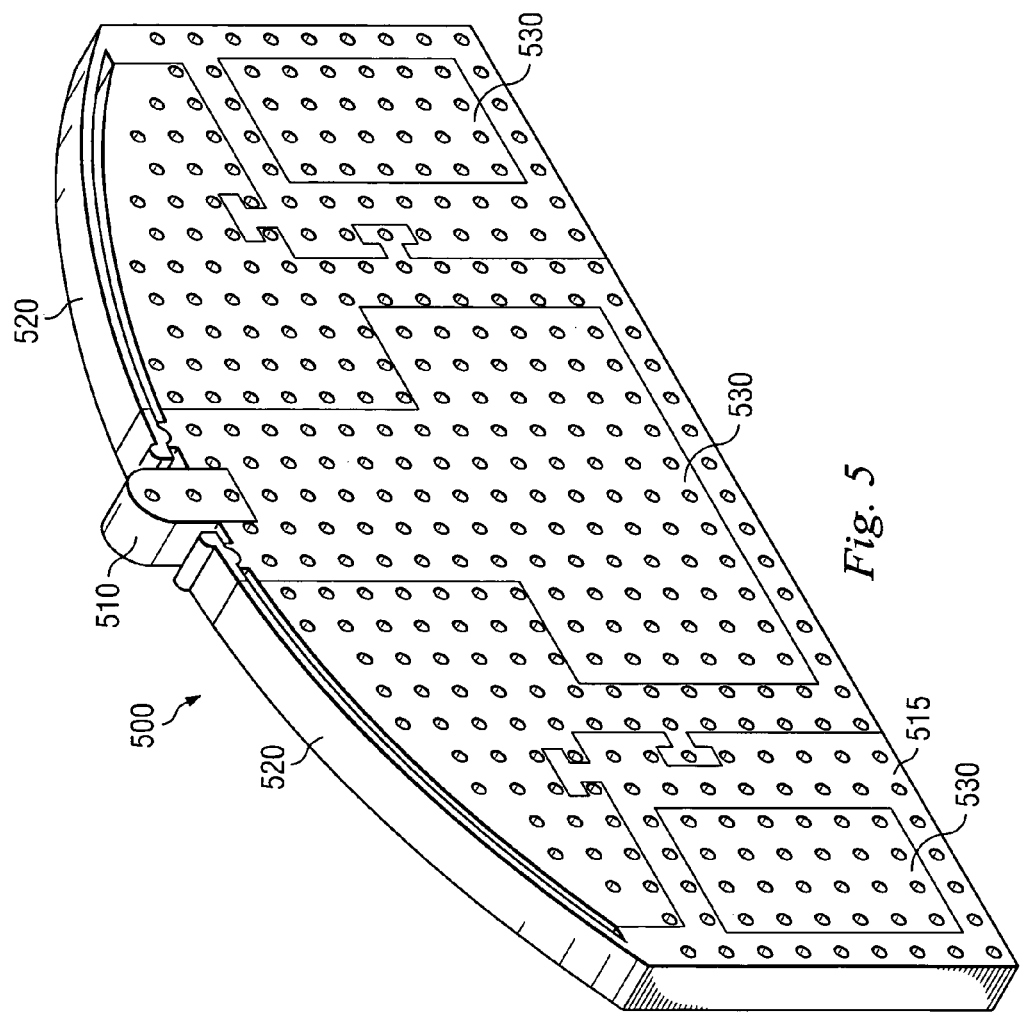
FIG. 5 illustrates a perspective view of one embodiment of a manipulation probe according to aspects of the present disclosure.

Referring to FIG. 5, illustrated is a perspective view of one embodiment of a manipulation probe 500 that may be employed during microassembly according to aspects of the present disclosure. In one embodiment, the manipulation probe 500 is substantially similar to the manipulation probe 210 shown in FIGS. 2a and 2b. The manipulation probe 500 may be substantially similar in composition and manufacture to the microconnector 300 shown in FIG. 3. In one embodiment, the manipulation probe 500 and the microconnector 300 (and possibly the retainer 400 shown in FIG. 4) are defined in a SCS layer over a common substrate, possibly simultaneously.

In the illustrated embodiment, the manipulation probe 500 includes a tip 510 extending from a body portion 515. The tip 510 is configured to be retained by a microconnector without requiring powered actuation of the tip 510 or the microconnector. For example, the tip 510 may be configured to be inserted into the handle 320 shown in FIG. 3, thereby deflecting portions of the handle 320, such that the handle 320 and the tip 510 may be frictionally engaged.

The manipulation probe 500 may also include deflectable sensor members 520. In the illustrated embodiment, the sensor members 520 are thin members offset a short distance (e.g., about 100 microns or less) from the perimeter of the body 515 and coupled to the body 515 distal from the tip 510. In this manner, the sensor members 520 may be deflected towards the body 515 upon insertion of the tip 510 into a microconnector. For example, a portion of a microconnector may bias the sensor members 520 towards the body 515. Consequently, the contact of the sensor members 520 with the body 515 may close an electrical circuit or otherwise provide an indication to a microassembly controller and/or operator that the tip 515 is inserted a distance into the microconnector sufficient for the manipulation probe 500 and the microconnector to be engaged. The manipulation probe 500 may also include probe pads, bond pads, or other contacts (hereafter collectively referred to as contacts) 530 for sensing contact of the sensor members 520 with the body 515.

Figure 6:
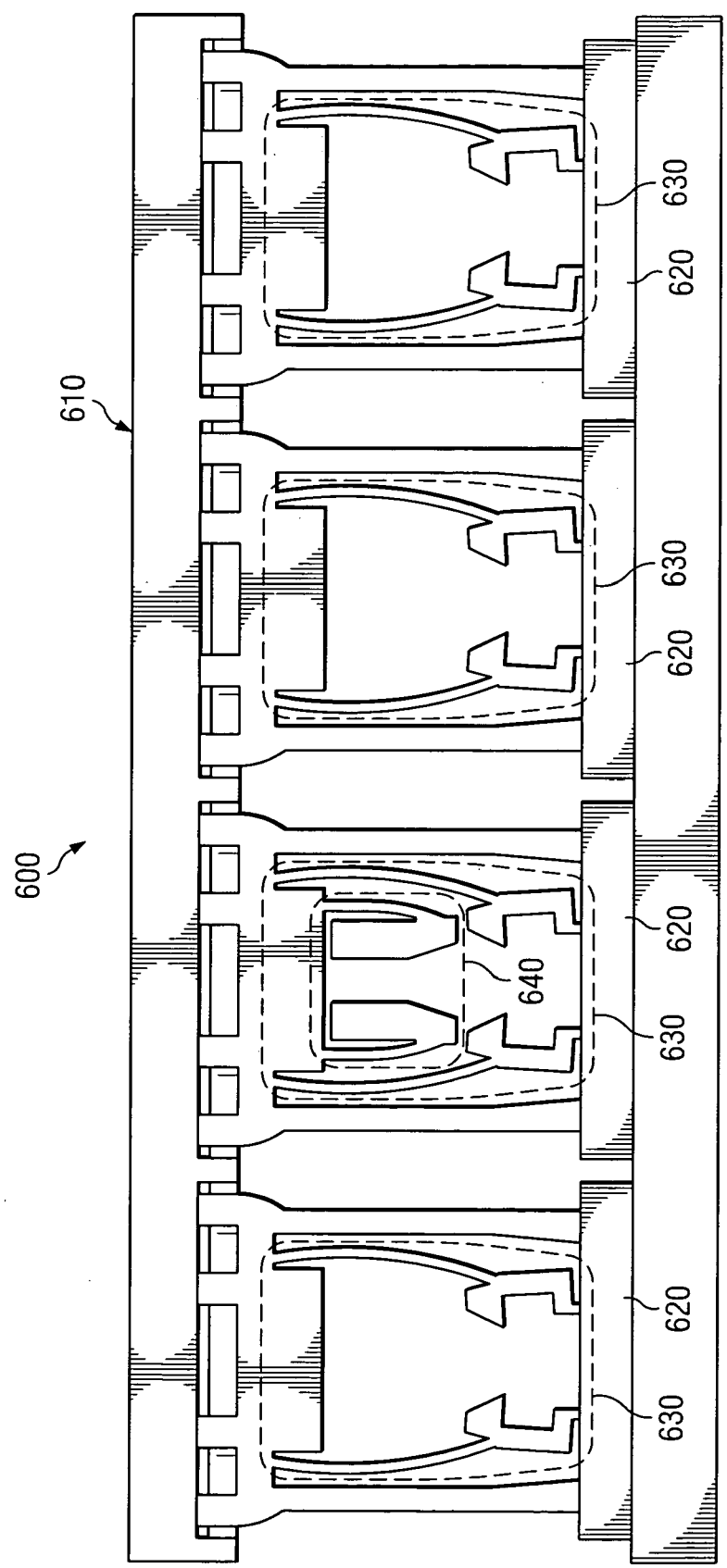
FIG. 6 illustrates a perspective view of another embodiment of a microassembly according to aspects of the present disclosure.

Referring to FIG. 6, illustrated is perspective view of another embodiment of a microassembly 600 according to aspects of the present disclosure. The microassembly includes a microconnector 610 and one or more receptacles 620. The microconnector 610 is substantially similar in composition and manufacture to the microconnector 300 shown in FIG. 3. However, the microconnector 610 includes a plurality of deflectable connection members 630 which may each be substantially similar to the deflective connection member 160 of FIG. 3. Each of the deflectable connection members 630 may be configured to engage or be engaged by a receptacle 620. The microconnector 610 also includes one or more handles 640 configured to engage or be engaged by a manipulation probe. However, as in the illustrated embodiment, the microconnector 610 may include only one handle 640 (or only two handles 640, such as where redundancy may be required). That is, each of the deflectable connection members 630 may be actuated by translation of a corresponding manipulation probe tip towards the receptacles 620, although not all of the manipulation probe tips may be engaged by a handle 640.

The receptacles 620 may each be substantially similar to the receptacle 400 shown in FIG. 4. However, in one embodiment, the receptacles 620 may be formed as a single, composite receptacle.

The manipulation probe employed during microassembly of the microconnector 610 the receptacles 620 may have a number of tips corresponding to the number of deflectable connection members 630. Otherwise, such a manipulation probe may be substantially similar to the manipulation probe 500 shown in FIG. 5. However, a manipulation probe having fewer tips than the number of deflectable connection members 630 may also be employed during microassembly. For example, a manipulation probe including only one tip may be employed during the microassembly of a microconnector 610 having a plurality of connection members 630. In one such embodiment, such as that illustrated in FIG. 6, the handle 640 is employed to manipulate and position the microconnector 610 with a single manipulation probe tip engaged by the handle 640, although the microconnector 610 includes 4 connection members 630. Once positioned, the single probe tip may be employed to engage one of the connection members 630 of the microconnector 610 with the receptacle(s) 620, such as by translating the probe tip away from the handle 640 and towards the receptacle(s) 620. Thereafter, the probe tip may be repositioned into one of the remaining connection members 630 and again translated toward the receptacle(s) 620 to engage a second connection member 630 with the receptacle(s) 620. This process may be repeated until each of the connection members 630 is engaged with the receptacle(s) 620.

Figure 7A:
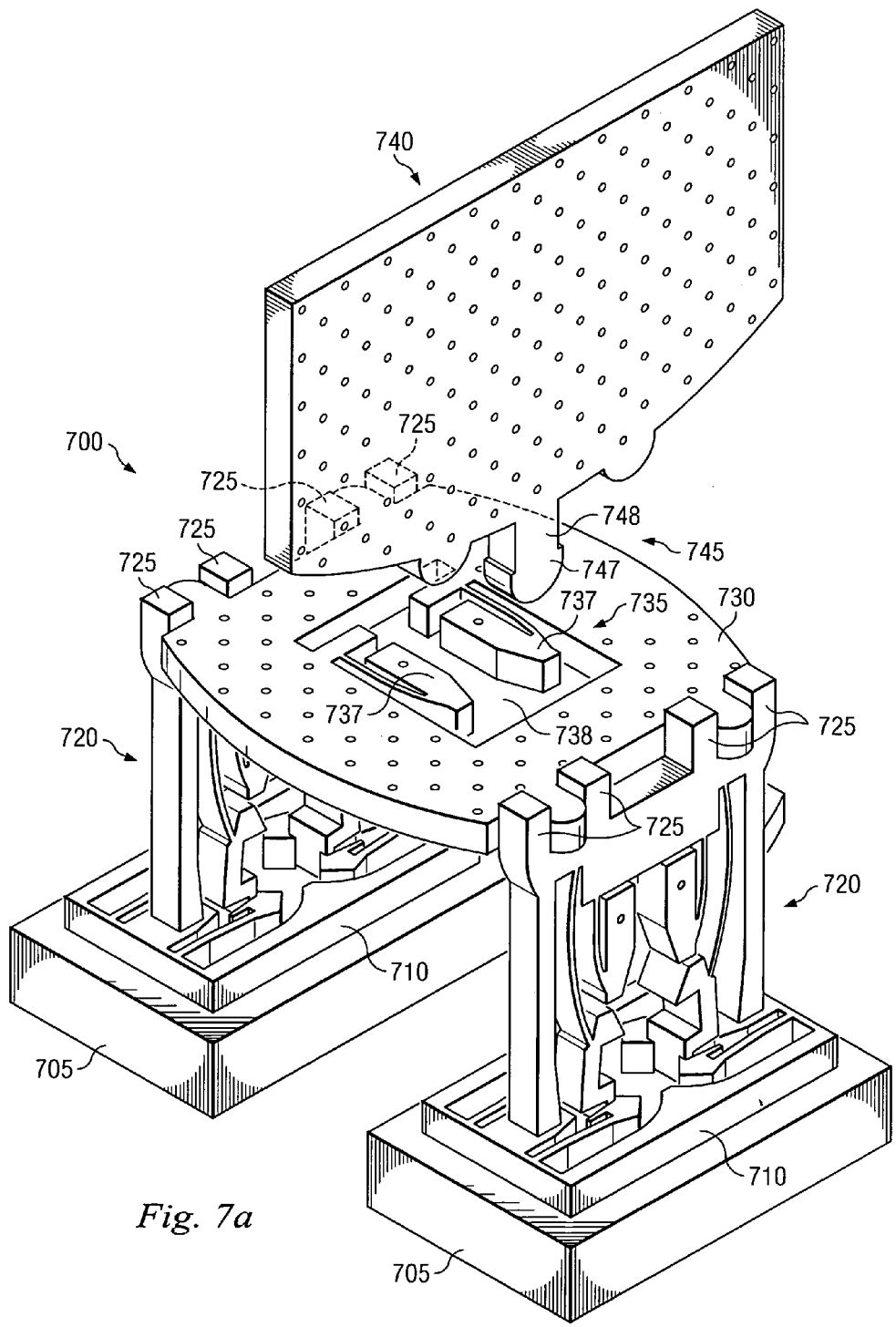
FIGS. 7a–c illustrate perspective views of another embodiment of a microassembly during intermediate stages of assembly according to aspects of the present disclosure.
Figure 7B:
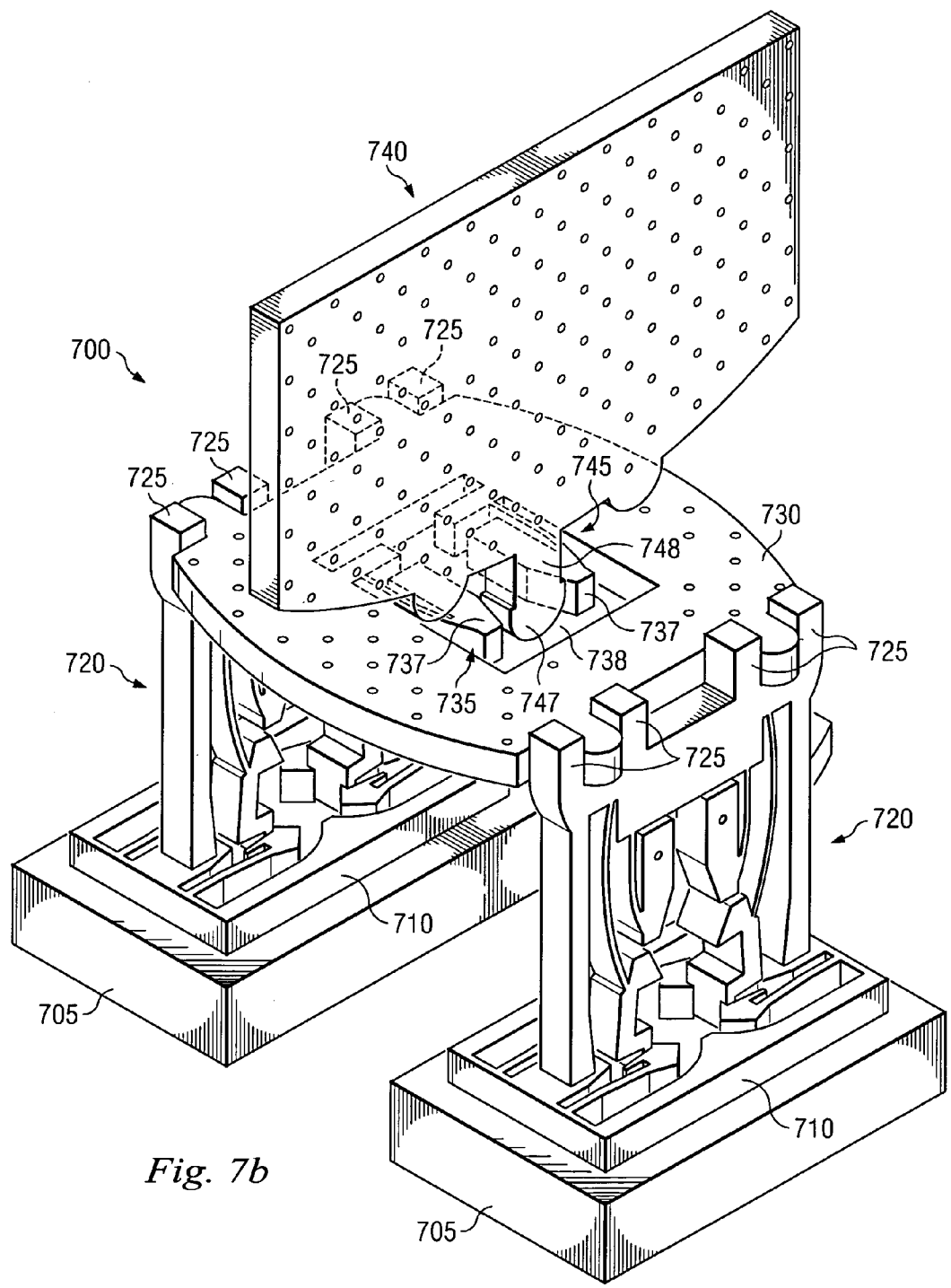
Figure 7C:
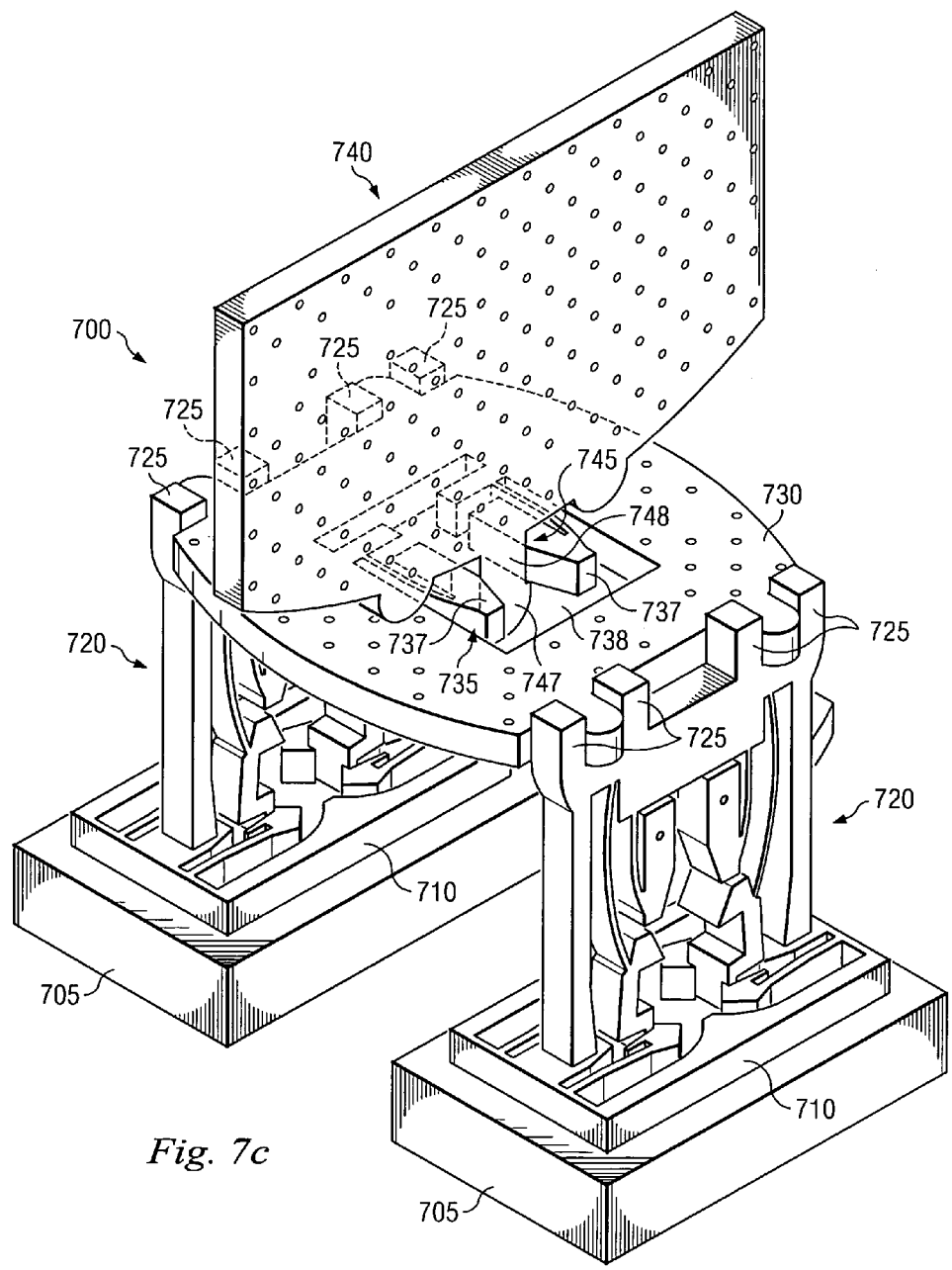

Referring to FIGS. 7a–c collectively, illustrated are perspective views of another embodiment of a microassembly 700 according to aspects of the present disclosure. The microassembly 700 includes two receptacles 710 oriented substantially parallel to a substrate 705, two microconnectors 720 assembled to the receptacles 710 in an orientation that is substantially orthogonal to the substrate 705, and a microconnector 730 assembled to the microconnectors 720 in an orientation that is substantially parallel to the substrate 705.

The receptacles 710 may each be substantially similar to the receptacle 400 shown in FIG. 4, and the microconnectors 720 may each be substantially similar to the microconnector 300 shown in FIG. 3. However, the microconnectors 720 may also include deflectable members 725 that may each be substantially similar to the deflectable members 360 shown in FIG. 3 and/or the retainers 410 shown in FIG. 4. For example, the members 725 may be configured to deflect outward to allow the receipt and engagement of a portion of the microconnector 730. The members 725 may be configured to engage protrusions 739 extending from the microconnector 730. In another embodiment, the microconnector 730 may include deflectable members configured to engage protrusions extending from the microconnectors 720. The microconnectors 720 may be assembled to the receptacles 710 by a microassembly method that is substantially similar to the methods described above in reference to FIGS. 1, 2a and 2b. A manipulation probe 740 which may be employed during such microassembly may include a probe tip 745 having a wider portion 747 and a narrower portion 748.

The microconnector 730 may be substantially similar in composition and manufacture to the microconnector 300 shown in FIG. 3. In the illustrated embodiment, the microconnector 730 includes a handle 735 configured to receive, engage, and/or be engaged by the tip 745 of the manipulation probe 740. The handle 735 may be substantially similar to the handle 320 shown in FIG. 3. For example, the handle 735 may include deflectable members 737 and an aperture 738 configured to receive and selectively retain the wider portion 747 of the manipulation probe tip 745. Thus, in one embodiment, the width of the wider portion 747 of the tip 745 may be about equal to or at least slightly greater than the width of the aperture 738, and the width of the narrower portion 748 of the tip 745 may be about equal to or at least slightly less than the width of the aperture 738.

During microassembly, the handle 735 and manipulation probe tip 745 are engaged such that the manipulation probe 740 may be translated, rotated, and otherwise manipulated to orient and align the microconnector 730 relative to the previously assembled microconnectors 720, as shown in FIG. 7a. The manipulation probe 740 may then be further translated towards the substrate 705, such that the microconnector 730 and the microconnectors 720 become fully engaged, and the manipulation probe tip 745 may travel further into the aperture 738 of the microconnector 730, as shown in FIG. 7b.

After the wider portion 747 of the manipulation probe tip 745 travels through the microconnector 730, as shown in FIG. 7b, the manipulation probe 740 may be translated substantially parallel to the substrate 705 and removed through a wider portion of the microconnector aperture 738, as shown in FIG. 7c.

Thus, the present disclosure introduces a MEMS microconnector including a compliant handle and a deflectable connection member. The compliant handle is configured to frictionally engage a manipulation probe. The deflectable connection member includes a first end coupled to the handle and a second end configured to deflect and thereby engage a receptacle in response to disengagement of the manipulation probe from the handle.

The present disclosure also provides a MEMS microconnector receptacle including a substrate, an aperture in the substrate configured to receive a microconnector in a pre-engaged orientation, and a deflectable retainer defined in the substrate. The deflectable retainer is configured to deflect away from a resting orientation in response to initial deflection of the microconnector, and is also configured to engage with the microconnector by returning towards the resting orientation in response to further deflection of the microconnector.

A MEMS microassembly is also provided in the present disclosure. In one embodiment, the microassembly includes a receptacle and a microconnector. The receptacle includes an aperture and a deflectable retainer. The microconnector includes a compliant handle configured to frictionally engage a manipulation probe, and also includes a deflectable connection member configured to deflect in response to translation of the manipulation probe away from the compliant handle, thereby causing the receptacle deflectable retainer to deflect, such that the deflectable retainer and the deflectable connection member may become engaged.

Another embodiment of a MEMS microassembly according to aspects of the present disclosure includes first and second substantially coplanar receptacles and first and second substantially parallel microconnectors coupled to the first and second receptacles, respectively. Such an embodiment also includes a third microconnector assembled to the first and second microconnectors and substantially parallel to the first and second receptacles. Assembly of the first and second microconnectors to the first and second receptacles, respectively, and of the third microconnector to the first and second microconnectors may also be achieved the engagement of deflectable connection members and deflectable retainers.

The present disclosure also introduces a method of assembling MEMS components. In one embodiment, the method includes frictionally engaging a microconnector with a manipulation probe, wherein the microconnector includes a deflectable connection member. The microconnector is oriented by manipulating the manipulation probe such that the connection member is proximate a receptacle, wherein the receptacle includes a deflectable retainer defining an aperture. A portion of the deflectable connection member is translated through the aperture by translating the manipulation probe until the microconnector contacts the receptacle. The manipulation probe is translated within the microconnector towards the receptacle to deflect the deflectable connection member and the deflectable retainer until the deflection of the deflectable retainer is allowed to decrease, the microconnector and the receptacle thereby becoming engaged.

A method of manufacturing a MEMS microassembly is also introduced in the present disclosure. In one embodiment, the method includes defining a microconnector and a receptacle from a layer formed over a substrate, engaging frictionally the microconnector and a manipulation probe, and orienting the microconnector opposite the receptacle from the substrate by manipulating the manipulation probe. The microconnector is translated towards the receptacle by manipulating the manipulation probe until the microconnector contacts the receptacle. The manipulation probe is translated within the microconnector towards the receptacle, the microconnector and the receptacle thereby becoming engaged.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A microconnector having feature dimensions not greater than about 1000 microns, comprising:
    a compliant handle configured to frictionally engage a manipulation probe; and
    a deflectable connection member having a first end coupled to the handle and a second end configured to deflect and thereby engage a receptacle in response to disengagement of the manipulation probe from the handle.

2. The microconnector of claim 1 wherein the disengagement of the manipulation probe from the handle includes translation of the manipulation probe away from the handle and towards the connection member.

3. The microconnector of claim 1 wherein the connection member includes two legs configured to deflect apart in response to the disengagement.

4. The microconnector of claim 3 wherein the two legs each include a barb configured to engage the receptacle.

5. The microconnector of claim 1 wherein the connection member includes opposing surfaces configured to engage opposing edges of the receptacle.

6. The microconnector of claim 1 further comprising a severable tether detachably coupling the microconnector to a substrate.

7. The microconnector of claim 1 further comprising an anchor arm coupled to the connection member and configured to contact the receptacle when the connection member and receptacle are engaged.

8. The microconnector of claim 1 further comprising a body coupled between the handle and the connection member, whereby the first end of the connection member is indirectly coupled to the handle through the body.

9. A microconnector receptacle having feature dimensions not greater than about 1000 microns, comprising:
    a substrate having an aperture configured to receive a microconnector in a pre-engaged orientation; and
    a deflectable retainer defined in the substrate and configured to:
        deflect away from a resting orientation in response to initial deflection of the microconnector; and
        engage the microconnector by returning towards the resting orientation in response to further deflection of the microconnector.

10. The microconnector receptacle of claim 9 wherein the retainer includes two legs configured to deflect apart in response to the initial deflection of the microconnector and return towards each other in response to the further deflection of the microconnector.

11. The microconnector receptacle of claim 9 wherein the two legs each include a barb configured to engage the microconnector.

12. The microconnector receptacle of claim 9 further comprising an anchor pad coupled to the retainer and configured to rest against the microconnector when the retainer and microconnector are engaged.

13. A microassembly, comprising:
    a receptacle having an aperture and a deflectable retainer; and
    a microconnector engaged with the receptacle, including:
        a compliant handle configured to frictionally engage a manipulation probe; and
        a deflectable connection member configured to deflect in response to translation of the manipulation probe away from the compliant handle, thereby causing the receptacle deflectable retainer to deflect, such that the deflectable retainer and the deflectable connection member may become engaged;
    wherein feature dimensions of at least one of the receptacle and the microconnector are not greater than about 1000 microns.

14. The microassembly of claim 13 wherein the receptacle and the microconnector are substantially parallel.

15. The microassembly of claim 13 wherein the receptacle deflectable retainer includes two retainer legs and the microconnector deflectable connection member includes two connection member legs, wherein the two retainer legs are configured to deflect in response to deflection of the two connection member legs, and wherein the two connection member legs are configured to deflect in response to translation of the manipulation probe away from the compliant handle.

16. The microassembly of claim 13 wherein each of the two retainer legs includes a retainer barb configured to engage the microconnector and each of the two connection member legs includes a connection member barb configured to engage the receptacle.

17. The microassembly of claim 13 wherein the receptacle is a first receptacle and the microconnector is a first microconnector, the microassembly further including:
    a second receptacle substantially similar to and substantially coplanar with the first receptacle;

a second microconnector substantially similar to substantially parallel to the first microconnector, the second microconnector assembled to the second receptacle; and a third microconnector assembled to the first and second microconnectors and substantially parallel to the first and second receptacles.

18. The microassembly of claim 16 wherein the first and second microconnectors each include a plurality of deflectable members configured to engage protrusions extending from the third microconnector.

19. The microassembly of claim 13 wherein:
the receptacle is a first receptacle in a plurality of substantially similar receptacles; and
the microconnector is a first microconnector in a plurality of substantially similar microconnectors each engaged with a corresponding one of the plurality of receptacles.

20. The microassembly of claim 19 wherein at least one of the plurality of microconnectors does not include the compliant handle.

21. The microassembly of claim 19 wherein only one of the plurality of microconnectors includes the compliant handle.

22. The microassembly of claim 13 wherein at least one of the microconnector and the manipulation probe includes means for electrically detecting engagement between the microconnector and the manipulation probe.

23. The microassembly of claim 13 wherein at least one of the microconnector and the receptacle includes means for electrically detecting engagement between the microconnector and the receptacle.

24. A method of assembling components having feature dimensions not greater than about 1000 microns, comprising:
engaging frictionally a microconnector with a manipulation probe, the microconnector having a deflectable connection member;
orienting the microconnector by manipulating the manipulation probe such that the connection member is proximate a receptacle, the receptacle having a deflectable retainer defining an aperture;
translating a portion of the deflectable connection member through the aperture by translating the manipulation probe until the microconnector contacts the receptacle; and
translating the manipulation probe within the microconnector towards the receptacle to deflect the deflectable connection member and the deflectable retainer until the deflection of the deflectable retainer is allowed to decrease, the microconnector and the receptacle thereby becoming engaged.

25. The method of claim 24 wherein orienting the microconnector includes maintaining substantial parallelism between the microconnector and the receptacle.

26. The method of claim 24 further comprising disengaging the manipulation probe from the microconnector.

27. The method of claim 24 wherein a first interface between manipulation probe and the microconnector and a second interface between the microconnector and the receptacle are each unpowered interfaces.

28. The method of claim 24 wherein the microconnector and the receptacle are each initially coupled to a substrate, the method further comprising de-tethering the microconnector from the substrate.

29. The method of claim 28 wherein the microconnector is de-tethered from the substrate prior to orienting the microconnector.

30. The method of claim 28 wherein de-tethering comprises mechanically breaking a tether coupling the microconnector to the substrate.

31. The method of claim 28 wherein de-tethering comprises electrically breaking a tether coupling the microconnector to the substrate.

32. A method of manufacturing a microassembly, comprising:
defining a microconnector and a receptacle from a layer formed over a substrate, wherein feature dimensions of at least one of the microconnector and the receptacle are not greater than about 1000 microns;
engaging frictionally the microconnector and a manipulation probe;
orienting the microconnector opposite the receptacle from the substrate by manipulating the manipulation probe;
translating the microconnector towards the receptacle by manipulating the manipulation probe until the microconnector contacts the receptacle; and
translating the manipulation probe within the microconnector towards the receptacle, the microconnector and the receptacle thereby becoming engaged.

33. The method of claim 32 wherein:
the microconnector includes a compliant handle and a deflectable connection member;
the receptacle includes a deflectable retainer defining an aperture;
the frictional engagement of the microconnector and the manipulation probe includes frictionally engaging the compliant handle and the manipulation probe;
orienting the microconnector opposite the receptacle form the substrate includes orienting the deflectable connection member proximate the receptacle aperture;
translating the microconnector towards the receptacle translates a portion of the deflectable connection member through the receptacle aperture; and
translating the manipulation probe within the microconnector deflects the deflectable connection member and the deflectable retainer until the deflection of the deflectable retainer is allowed to decrease, the microconnector and the receptacle thereby becoming engaged.

34. The method of claim 32 wherein orienting the microconnector opposite the receptacle from the substrate includes maintaining substantial parallelism between the microconnector and the receptacle.

35. The method of claim 32 wherein orienting the microconnector opposite the receptacle from the substrate includes rotating the microconnector relative to the receptacle to orient the microconnector substantially perpendicular to the receptacle.

36. The method of claim 32 wherein the microconnector includes a tether coupled to the substrate, the method further comprising severing the tether after engaging the microconnector and the manipulation probe.

37. A microconnector having feature dimensions not greater than about 1000 microns, comprising:
a body;
a compliant handle extending from the body and configured to frictionally engage a manipulation probe.

38. The microconnector of claim 37 wherein the compliant handle includes at least two deflectable members extending from the body and spaced apart in such a manner as to frictionally engage the manipulation probe therebetween.

39. The microconnector of claim 37 further comprising at least one anchor arm extending from the body beyond the compliant handle such that translation of the manipulation probe from an engaged position within the compliant handle in a direction away from the body disengages the manipulation probe from the compliant handle.

40. The microconnector of claim 37 further comprising extensions extending away from the body and having end points beyond the compliant handle, the extensions forming an opening between the end points and the compliant handle such that translation of the manipulation probe from an engaged position within the compliant handle towards the opening disengages the manipulation probe from the compliant handle.

* * * * *